(12) United States Patent
Bains et al.

(10) Patent No.: US 7,349,233 B2
(45) Date of Patent: Mar. 25, 2008

(54) MEMORY DEVICE WITH READ DATA FROM DIFFERENT BANKS

(75) Inventors: Kuljit S. Bains, Olympia, WA (US); John Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/388,464

(22) Filed: Mar. 24, 2006

(65) Prior Publication Data

US 2007/0223264 A1    Sep. 27, 2007

(51) Int. Cl.
G11C 5/06 (2006.01)
G11C 5/02 (2006.01)
G11C 7/10 (2006.01)

(52) U.S. Cl. .............. 365/63; 365/51; 365/189.02; 365/230.03

(58) Field of Classification Search ............ 365/63
See application file for complete search history.

(56) References Cited

U.S. PATENT DOCUMENTS

| | | | |
|---|---|---|---|
| 5,228,132 A * | 7/1993 | Neal et al. ............ 711/5 |
| 5,701,271 A * | 12/1997 | Lee ............ 365/230.02 |
| 5,991,819 A | 11/1999 | Young |
| 6,209,056 B1 * | 3/2001 | Suh ............ 711/5 |
| 6,273,759 B1 | 8/2001 | Perino et al. |
| 6,404,693 B1 * | 6/2002 | Choi et al. ............ 365/230.03 |
| 6,502,161 B1 * | 12/2002 | Perego et al. ............ 711/5 |
| 6,621,757 B2 * | 9/2003 | Lee ............ 365/230.03 |
| 6,674,648 B2 | 1/2004 | McCall et al. |
| 6,766,385 B2 | 7/2004 | Dodd et al. |
| 6,785,190 B1 | 8/2004 | Bains et al. |
| 6,831,924 B1 | 12/2004 | Cornett et al. |
| 6,877,071 B2 | 4/2005 | Sherman |
| 6,954,822 B2 | 10/2005 | Bains et al. |
| 6,961,831 B2 | 11/2005 | Ware et al. |
| 6,996,686 B2 * | 2/2006 | Doblar et al. ............ 711/157 |
| 7,024,518 B2 | 4/2006 | Halbert et al. |
| 7,196,962 B2 * | 3/2007 | Lee ............ 365/230.05 |
| 7,206,897 B2 * | 4/2007 | Perego et al. ............ 711/105 |
| 2002/0023191 A1 | 2/2002 | Fudeyasu |
| 2003/0076702 A1 * | 4/2003 | Kyung et al. ............ 365/51 |
| 2004/0236921 A1 | 11/2004 | Bains |
| 2005/0071536 A1 | 3/2005 | Osborne |
| 2005/0071541 A1 | 3/2005 | Osborne |
| 2005/0091460 A1 | 4/2005 | Rotithor et al. |
| 2005/0108469 A1 | 5/2005 | Freeman et al. |
| 2005/0122824 A1 * | 6/2005 | Lee ............ 365/230.05 |
| 2005/0144375 A1 | 6/2005 | Bains et al. |
| 2006/0271609 A1 * | 11/2006 | Takahashi et al. ............ 708/200 |

* cited by examiner

Primary Examiner—Son L. Mai
(74) Attorney, Agent, or Firm—Alan K. Aldous

(57) ABSTRACT

In some embodiments, a chip includes at least four groups of memory banks and at least four groups of output conductors wherein each group of output conductors corresponds to a different one of the groups of memory banks. The chip also includes circuitry to perform a read operation by providing read data from at least one of the banks of each of the groups of memory banks to its corresponding group of output conductors. Other embodiments are described.

28 Claims, 10 Drawing Sheets

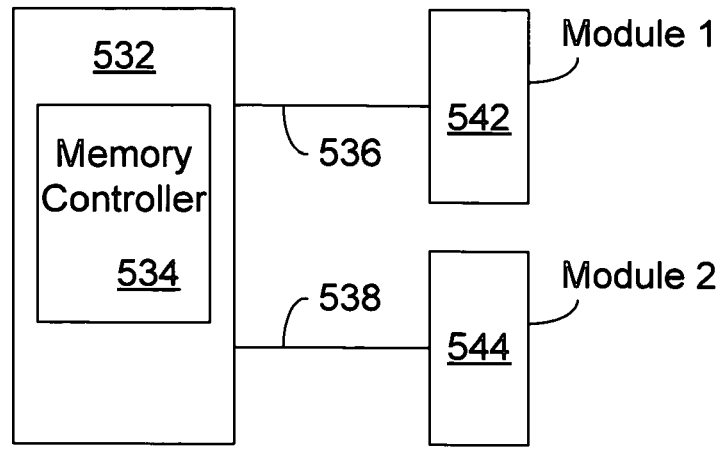
FIG. 14
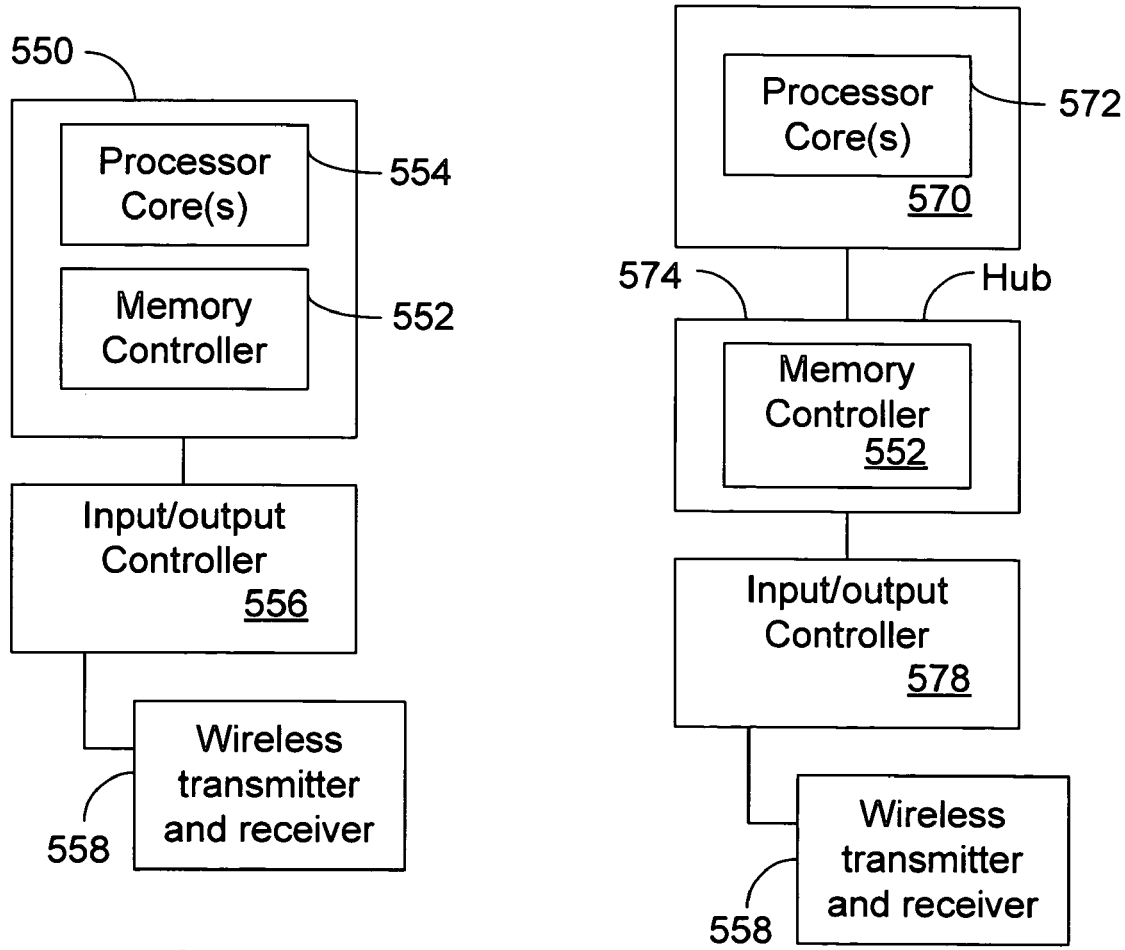
FIG. 15
FIG. 16

MEMORY DEVICE WITH READ DATA FROM DIFFERENT BANKS

BACKGROUND

1. Technical Field

The present inventions relate to memory devices that provide read data from different banks.

2. Background Art

Various arrangements for memory devices in a memory system have been proposed. For example, in a traditional synchronous dynamic random access memory (DRAM) system, memory devices communicate data through bidirectional data buses and receive commands and addresses through command and addresses buses. In some implementations, the memory devices have stubs that connect to the buses in a multi-drop configuration. Other designs include point-to-point signaling. Bidirectional signaling may be sequential or simultaneous.

Many memory devices have more than one memory bank. Each bank is a section of memory that can be accessed separately from the other banks. In typical DRAM memory devices, as one bank is being read another bank may be written to, or another bank may be prepared for later reading or writing. However, two banks are written to or not read from at the same time. The memory cells of the banks are typically accessed through rows (sometimes called word lines (WL)) and columns.

Over the years, with new generations of memory devices, a read operation (such as a prefetch operation) has involved an increasingly larger number of bits being read from a bank. For example, with Double Data Rate DDR SDRAM memories, 16 bits are read from a bank at a time. In DDR2 memories, 32 bits are read from a bank at a time. In DDR3 memories, there may be 64 bits of data read from a bank at a time. Under the current approach, the number of read data bits will keep doubling leading to an increase in chip (die) size.

Some memory chips may be used as either X4 devices (four DQ data pads) or X8 devices (eight DQ data pads). If the chip is used as a X8 device, then all eight of the DQ pads are used. If the chip is used as a X4 device, then four of the DQ pads are not used. There are also X16 memory chips, but they have a substantially larger die and associated package.

Memory modules include a substrate on which a number of memory devices are placed. The memory devices may be placed on only one side of the substrate or on both sides of the substrate. In some systems, a buffer is also placed on the substrate. For at least some signals, the buffer interfaces between the memory controller (or another buffer) and the memory devices on the module. In such a buffered system, the memory controller can use different signaling (for example, frequency and voltage values, and point-to-point versus a multi-drop arrangement) with the buffer than the buffer uses with the memory devices. A dual in-line memory module (DIMM) is an example of a memory module. Multiple modules may be in series and/or parallel. In some memory systems, a memory device receives signals and repeats them to a next memory device in a series of two or more memory devices.

Memory controllers have been used in chipset hubs and in a chip that includes a processor core. Some computer systems include wireless transmitter and receiver circuits.

BRIEF DESCRIPTION OF THE DRAWINGS

The inventions will be understood more fully from the detailed description given below and from the accompanying drawings of embodiments of the inventions which, however, should not be taken to limit the inventions to the specific embodiments described, but are for explanation and understanding only.

FIGS. 12-16 are each a block diagram representation of a system including a memory controller.

DETAILED DESCRIPTION

Figure 1:
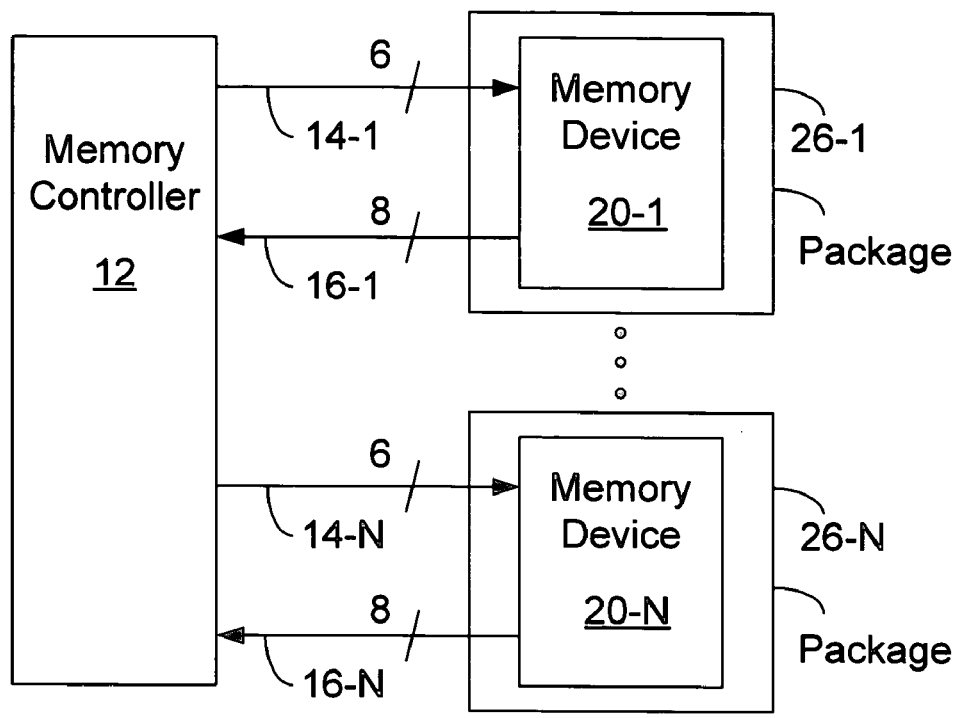
FIGS. 1-2 are each a block diagram representation of a memory system including a memory controller and memory devices in packages.

Referring to FIG. 1, a system includes a memory controller 12 coupled to memory devices 20-1 . . . 20-N through point-to-point interconnects 14-1 . . . 14-N and 16-1 . . . 16-N. In some embodiments, interconnects 14-1 . . . 14-N carry address, command, and write data signals to devices 20-1 . . . 20-N, although in other embodiments the address, command, and write data signals do not have to be on the same conductors. In some embodiments, interconnects 16-1 . . . 16-N carry read data from memory devices 20-1 . . . 20-N, respectively, to memory controller 12. In FIG. 1, memory devices 20-1 . . . 20-N are shown as integrated circuit chips that are at least partially surrounded by packages 26-1 . . . 26-N, respectively. Packages are not used in some embodiments. In some embodiments, one or more of memory devices 20-1 . . . 20-N might be part of an integrated circuit chip that performs functions in addition to being a memory device. Memory devices 20-1 . . . 20-N may be DRAMs or some other type of memory.

As illustrated in FIG. 1, interconnects 14-1 . . . 14-N each have six lanes, which may be single ended or differential. As illustrated in FIG. 1, interconnects 16-1 . . . 16-N each have eight lanes, which may be single ended or differential. Accordingly, chips 20-1 . . . 20-N may be referred to as X8 chips.

Figure 2:
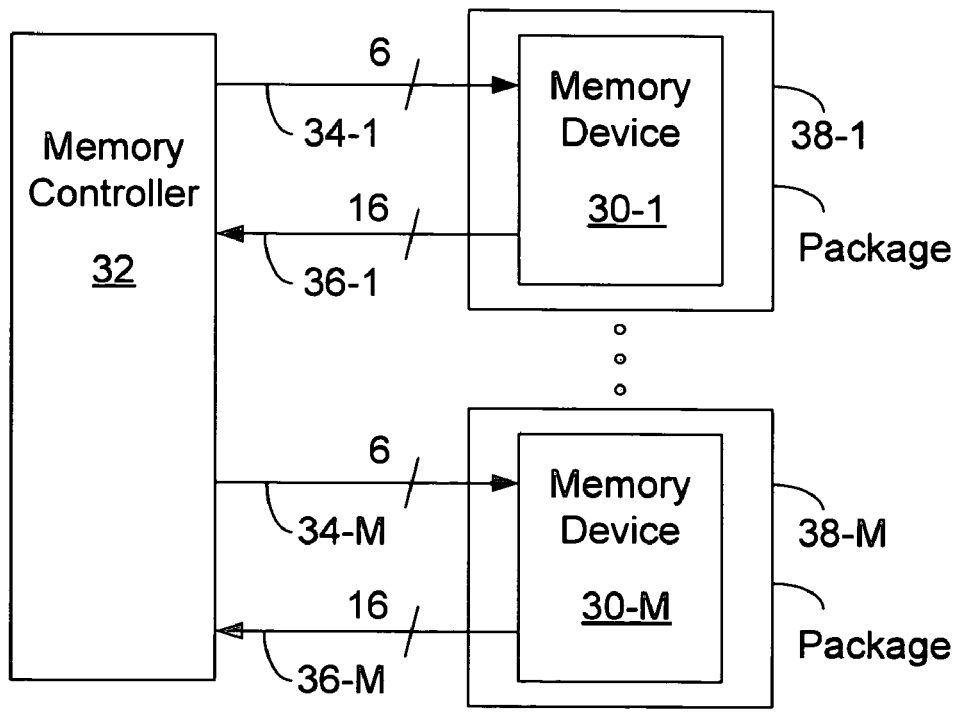

Referring to FIG. 2, a system includes a memory controller 32 coupled to memory devices 30-1 . . . 30-M through point-to-point interconnects 34-1 . . . 34-M and 36-1 . . . 36-M. In FIG. 2, memory devices 30-1 . . . 30-N are shown as integrated circuit chips that interface with packages 38-1 . . . 38-M, respective. As an example, the number "M" might be ½ the number "N." For example, if N were 8, then M might equal 4. However, M does not have to be ½ of N. Interconnects 34-1 . . . 34-M and 36-1 . . . 36-M may carry the same type of signals as interconnects 14-1 . . . 14-N and 16-1 . . . 16-N. As illustrated in FIG. 2, interconnects 34-1 . . . 34-M each have six lanes and interconnects 36-1 . . . 36-M each have 16 lanes. Accordingly, chips 30-1 . . . 30-N may be referred to as X16 chips. Note that if N is twice M, but interconnects 36-1 . . . 36-M each have twice the number of lanes as interconnects 16-1 . . . 16-N, then the total number of lanes of interconnects 16-1 . . . 16-N equals the total number of lanes of interconnects 36-1 . . . 36-N.

Memory controller 12 and memory controller 32 may be identical or different. The inventions are not restricted to the details of FIGS. 1 and 2. The systems of FIGS. 1 and 2 may include interconnects and chips in addition to those illustrated in FIG. 1. Interconnects 14-1 . . . 14-N, 16-1 . . . 16-N, 34-1 . . . 34-M, and 36-1 . . . 36-M may have a different number of lanes than shown. Interconnects 14-1 . . . 14-N, 16-1 . . . 16-N, 34-1 . . . 34-M, and 36-1 . . . 36-M may be unidirectional (that is, they are used to carry signals in only one direction) or sequential or simultaneous bi-directional.

Figure 3:
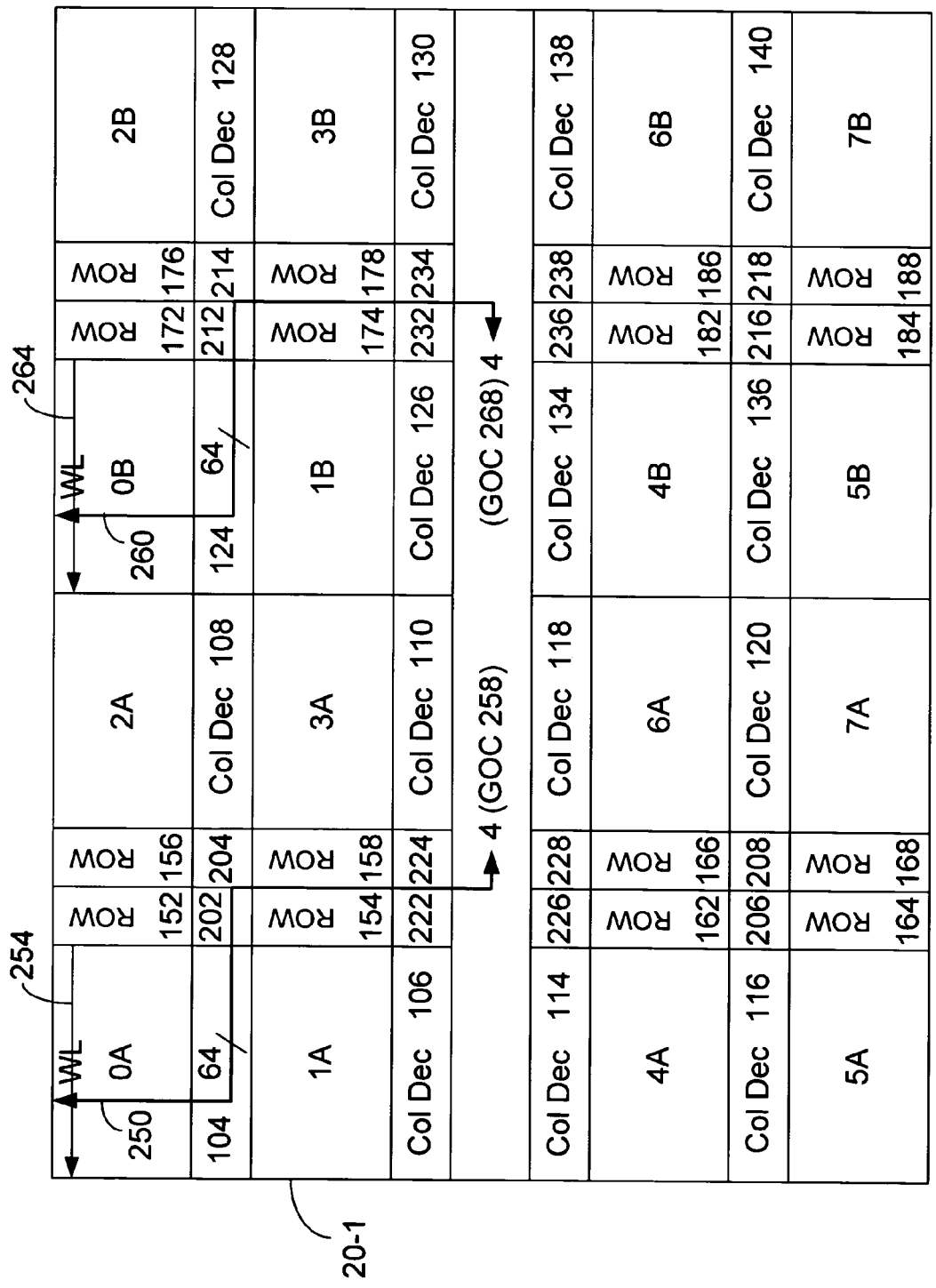
FIGS. 3-6 are each schematic representations of a memory device layout.
Figure 4:
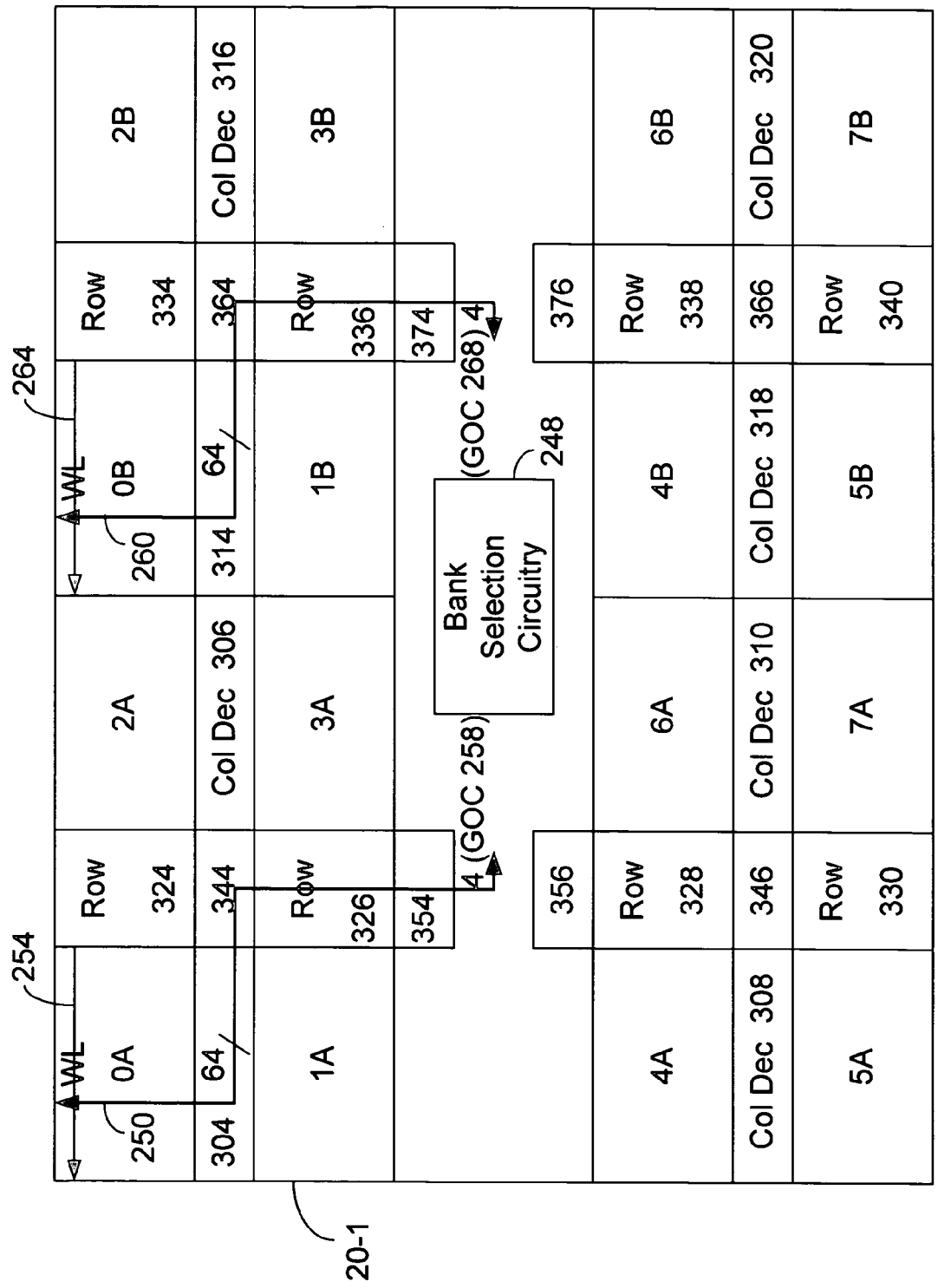
Figure 5:
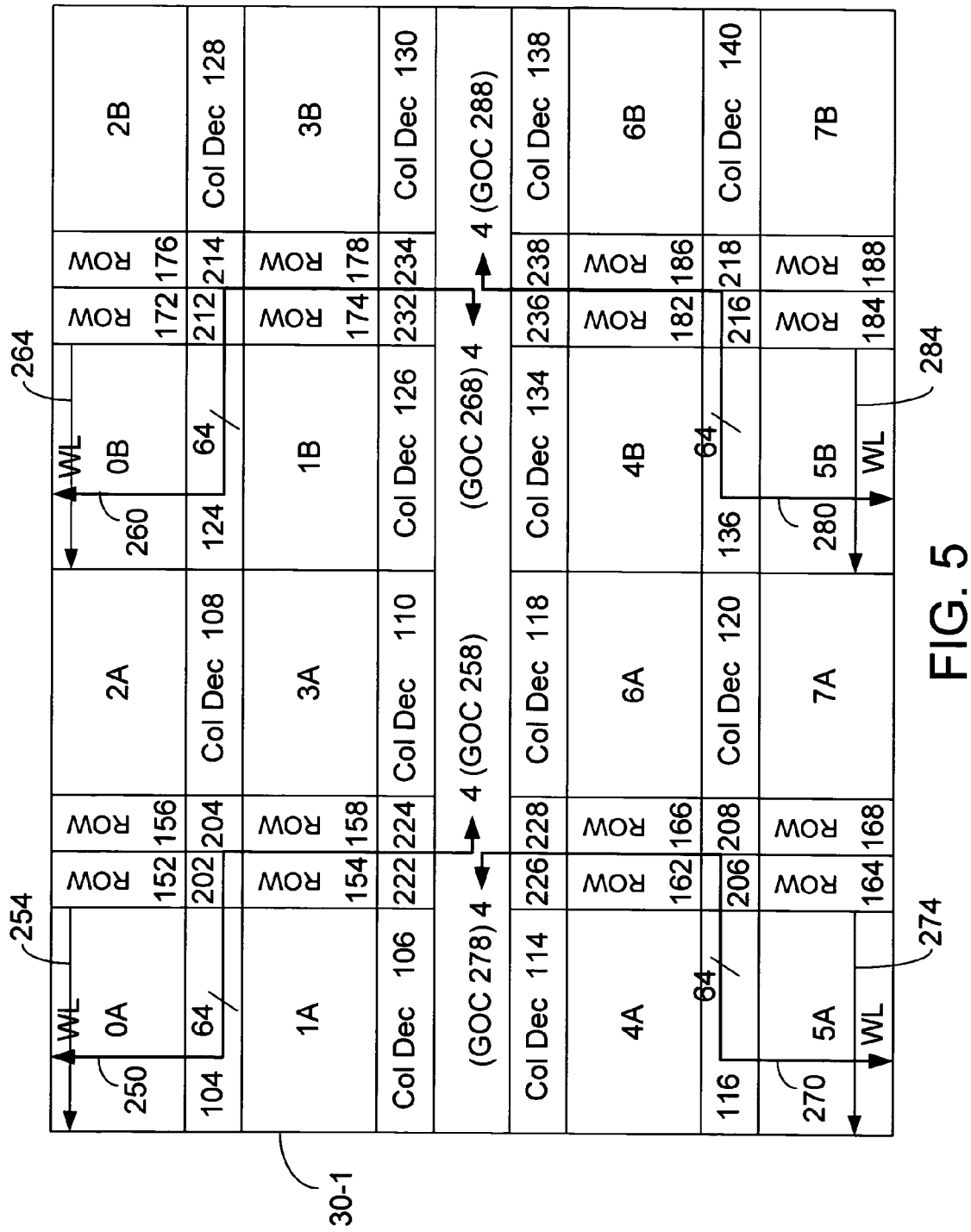
Figure 6:
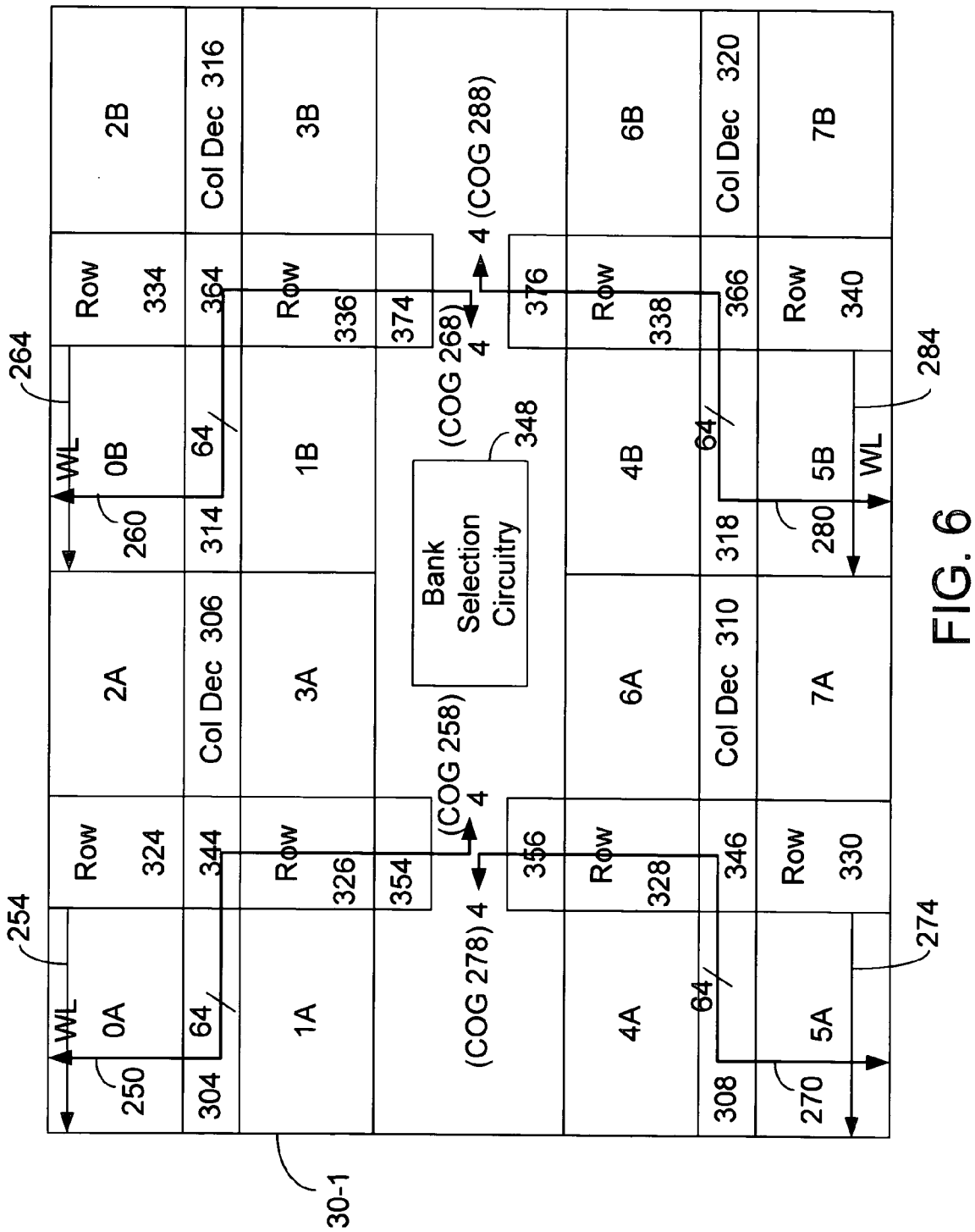

FIGS. 3 and 4 illustrate various components of an example of memory device 20-1 and FIGS. 5 and 6 illustrate various components of an example of memory device 30-1. However, memory devices 20-1 and 30-1 of FIGS. 1 and 2 are not restricted to the details of the examples of FIGS. 3-6. Further, memory devices 20-1 and 30-1 may include additional components not illustrated in FIGS. 3-6. In some embodiments, a single memory device may switch between operating like memory device 20-1 and 30-1. In other embodiments, a memory device must operate either like memory device 20-1 or like memory device 30-1, but not have the ability to switch the type of operation.

Referring to FIG. 3, memory device 20-1 includes 16 banks in a split bank architecture which are referred to as banks 0A, 1A, 2A, 3A, 4A, 5A, 6A, and 7A (0A-7A) and banks 0B, 1B, 2B, 3B, 4B, 5B, 6B, and 7B (0B-7B). A first group of memory banks includes banks 0A-7A and a second group of memory banks includes banks 0B-7B. Other embodiments of the memory devices may include more or less than 16 banks. As an alternative, in some embodiments, banks 0A-3A and 0B-3B may be a first group of memory banks and banks 4A-7A and 4B-7B may be a second group of memory banks.

As illustrated in FIG. 3, a row or word line (WL) 254 of bank 0A is selected by row decoder circuitry 152. An arrowed line 250 represents 64 lines with 64 bits of read data from various selected columns of WL 254 and associated sense amplifiers. Multiplexer circuitry 202 multiplexes the 64 lines to four lines in, for example, a time sequential fashion. The four read data bits on the four lines are directed by address decoding and routing circuitry 222 to a group of conductors 258. Group of conductors 258 includes four lines if single ended signaling is used at eight lines if differential signaling is used.

Simultaneously, a row or word line (WL) 264 of bank 0B is selected by row decoder circuitry 172. An arrowed line 260 represents 64 lines and 64 bits of read data from various selected columns of from WL 264 and associated sense amplifiers. Multiplexer circuitry 212 multiplexes the 64 lines to 4 lines in, for example, a time sequential fashion. The 4 lines are provided by address decoding and routing circuitry 232 to group of conductors 268 which includes four lines (eight if differential signaling is used). Accordingly, there are eight lines (sixteen if differential signaling is used) from groups of conductors 258 and 268 to interconnects 16-1 in FIG. 1. There may be circuitry between address decoding and routing circuitry 222 and conductors 258 and between address decoding and routing circuitry 232 and conductors 268.

In FIG. 3, for at least some read operations, a pair of banks is read from. One of banks 0A-7A is read from to provide read data to group of conductors 258, and one of banks 0B-7B is read from to provide read data to conductors 268.

In the illustration of FIG. 3, banks 0A and 0B are being read from. Although a pair of banks (such as 0A and 0B) are physically separated, they may be considered to be logically one bank. As an example, in some embodiments, banks 2A and 2B may be simultaneously read from. In that case, word lines would be selected by row decoders 156 and 176 and columns would be selected by column decoders 108 and 128. Multiplexers 204 and 214 each would multiplex for 64 lines to 4 lines and address decoding and routing circuitry 224 and 234 would provide the read data to groups of conductors 258 and 268, respectively. As another example, in different embodiments, banks 2A and 3B might be selected simultaneously to form a signal logical bank. However, in some embodiments, the same pair of banks are always selected together. In these embodiments, either bank 2A is always selected with the same bank (bank 2B in the first example, and bank 3B in the second example).

Table 1 below gives an example of bank pairing (although the bank pairing is different in other embodiments). Table 1 also identifies row decoders, column decoders, multiplexers, and address decoding and routing circuitry for the banks of FIG. 3.

TABLE 1

| Bank | Pair Bank | Row Decoder | Column Decoder | Multi-plexer | Address Decoding |
|---|---|---|---|---|---|
| 0A | 0B | 152 | 104 | 202 | 222 |
| 1A | 1B | 154 | 106 | 202 | 222 |
| 2A | 2B | 156 | 108 | 204 | 224 |
| 3A | 3B | 158 | 110 | 204 | 224 |
| 4A | 4B | 162 | 114 | 206 | 226 |
| 5A | 5B | 164 | 116 | 206 | 226 |
| 6A | 6B | 166 | 118 | 208 | 228 |
| 7A | 7B | 168 | 120 | 208 | 228 |
| 0B | 0A | 172 | 124 | 212 | 232 |
| 1B | 1A | 174 | 126 | 212 | 232 |
| 2B | 2A | 176 | 128 | 214 | 234 |
| 3B | 3A | 178 | 130 | 214 | 234 |
| 4B | 4A | 182 | 134 | 216 | 236 |
| 5B | 5A | 184 | 136 | 216 | 236 |
| 6B | 6A | 186 | 138 | 218 | 238 |
| 7B | 7A | 188 | 140 | 218 | 238 |

TABLE 2

| Bank | Pair Bank | Row Decoder | Column Decoder | Multi-plexer | Address Decoding |
|---|---|---|---|---|---|
| 0A | 0B | 324 | 304 | 344 | 354 |
| 1A | 1B | 326 | 304 | 344 | 354 |
| 2A | 2B | 324 | 306 | 344 | 354 |
| 3A | 3B | 326 | 306 | 344 | 354 |
| 4A | 4B | 328 | 308 | 348 | 356 |
| 5A | 5B | 330 | 308 | 348 | 356 |
| 6A | 6B | 328 | 310 | 348 | 356 |
| 7A | 7B | 330 | 310 | 348 | 356 |
| 0B | 0A | 334 | 314 | 364 | 374 |
| 1B | 1A | 336 | 314 | 364 | 374 |
| 2B | 2A | 334 | 316 | 364 | 374 |
| 3B | 3A | 336 | 316 | 364 | 374 |
| 4B | 4A | 338 | 318 | 368 | 376 |
| 5B | 5A | 340 | 318 | 368 | 376 |
| 6B | 6A | 338 | 320 | 368 | 376 |
| 7B | 7A | 340 | 320 | 368 | 376 |

In some embodiments, banks may share row decoders, column decoders, and/or decoding and routing circuitry. For example, FIG. 4 illustrates an example of memory device 20-1 in which row decoders, column decoders, and decoding and routing circuitry are shared between banks. Table 2 summarizes which banks share row decoders, column decoders, and decoding and routing circuitry, but other embodiments could have different pairings, etc.

Bank selection circuitry 248 may select the banks based on a bank field in the addresses. Bank selection circuitry 248 is shown in FIG. 4, but not FIG. 3 because of space limitations in FIG. 3.

The example of memory device 30-1 in FIG. 5 is similar to the example of memory device 20-1 in FIG. 3. However, in addition to including groups of conductors 258 and 268, memory device 30-1 includes group of conductors 278 and group of conductors 288. In FIG. 5, groups of conductors 278 and 288 each include four lines (eight if differential signaling is used). Word lines 274 and 284 are illustrated in banks 5A and 5B, respectively. Arrowed lines 270 and 280 each represents 64 lines of read data from various selected columns of WLs 274 and 284, and associated sense amplifiers.

In FIG. 5, banks 0A, 1A, 2A, and 3A may be thought of as a first group of memory banks, banks 4A, 5A, 6A, and 7A may be thought of as second group of memory bank, banks 0B, 1B, 2B, and 3B may be thought of as third group of memory banks, and banks 4B, 5B, 6B, and 7B may be thought of as a fourth group of memory banks. In the example of FIG. 5, groups of conductors 258, 268, 278, and 288 simultaneously receive read data from one bank in each of the groups of memory banks. In the example of FIG. 5, as part of a read operation, read data is read from one of the banks of each group of memory banks. Group of conductors 258 receive read data from one of banks 0A, 1A, 2A, and 3A, group of conductors 268 receive read data from one of banks 4A, 5A, 6A, and 7A, group of conductors 278 receive read data from one of banks 0B, 1B, 2B, and 3B, and group of conductors 288 receive read data from one of banks 4B, 5B, 6B, and 7B. The four banks from the different groups of memory banks may be considered one logical bank.

In the example of FIG. 5, groups of conductors 258, 268, 278, and 288 each include four lines (eight if differential). Accordingly, sixteen output lines (thirty-two if differential) simultaneously provide read data to, for example, interconnects 36-1 in FIG. 2. With sixteen lanes, device 30-1 is referred to as a X16 part.

In some embodiments, memory device 30-1 may only choose from one of the four combinations of banks. An example of these four combinations of banks as follows: combination 1: banks 0A, 4A, 0B, and 4B; combination 2: banks 1A, 5A, 1B, and 5B; combination 3: banks 2A, 6A, 2B, and 6B; and combination 4: banks 3A, 7A, 3B, and 7B. Of course, the four combination of banks could be different than the example just given. In other embodiments, the number of available combinations of banks may be greater that four.

FIG. 6 is another example of memory device 30-1 with shared row decoders, column decoders, and decoding and routing circuitry similar to that discussed in connection with FIG. 4 and Table 2. Bank selection circuitry 238 may select the banks based on a field in the addresses. Bank selection circuitry 348 is shown in FIG. 6, but not FIG. 5 because of space limitations in FIG. 3.

In some embodiments, a common die (the same chip) can be used for either a memory device 20-1 or a memory device 30-1. In this case, both memory devices 20-1 and 30-1 have sixteen output conductors (32 if differential). In some embodiments in which the same chip is used, at the time of manufacture, 8 of the 16 output conductors are made inoperative and the memory device operates as in, for example, FIG. 3 or 4. In other embodiments in which the same chip is used, memory devices 20-1 and 30-1 can switch back and forth between operating as a X8 and a X16 memory device. For example, at the time of boot up or hot plugging, memory controller 12 or 32 could send signals to memory device 20-1 or 30-1 to control whether they operate as X8 or X 16 chips. In other embodiments, a different chip is used for memory devices 20-1 and 30-1 and they memory device 20-1 never did have 16 output conductors. A fuse or other circuitry may be used to control whether a system like that in FIG. 3 or 4 or like that in FIG. 5 or 6 is created. In some embodiments, the memory devices reads the state of the fuse at device initialization and sets the number of data lines (e.g., X4, X8, X16, or X32). In other embodiments, once the fuse is set, the number of data lines cannot change. In still other embodiments, the fuse or other circuitry are stored off the memory devices and read by the memory controller, which in turn provides the information to the memory devices. In some embodiments, a X4 device can be achieved through devices 20-1 or 30-1 in FIGS. 3-6 by reading from one bank at a time and providing the read data to only one group of conductors, such as GOC 258.

Groups of conductors 258 and 268 are output conductors in that they carry read data as output signals to interconnects 16-1 in FIG. 1. Likewise, groups of conductors 258, 268, 278, and 288 are output conductors in that they carry read data as output signals to interconnects 36-1. However, if bidirectional data signaling is used, group of conductors 258, 268, 278, and 288 may also be input conductors and used to carry write data. The letters DQ are sometimes used to represent chip data conductors.

In other embodiments, data is read from more than one bank from each group of memory banks at a time. For example, in FIG. 5, simultaneously data might be read from banks 0A and 3A of the first group of memory banks, banks 4A and 7A of the second group of memory banks, banks 4A and 7A of the second group of memory banks, banks 0B and 3B of the third group of memory banks, and banks 4B and 7B of the fourth group of memory banks. If four lines come from each bank, these embodiments would provide read data to 32 output conductors (64 if differential signaling is used). Alternatively, the banks may provide two lines each to provide read data to 16 output conductors (32 if differential signaling is used). If two groups of banks is used, four banks from each group could be used to provide read data to 16 output conductors (32 if differential signaling is used).

Figure 7:
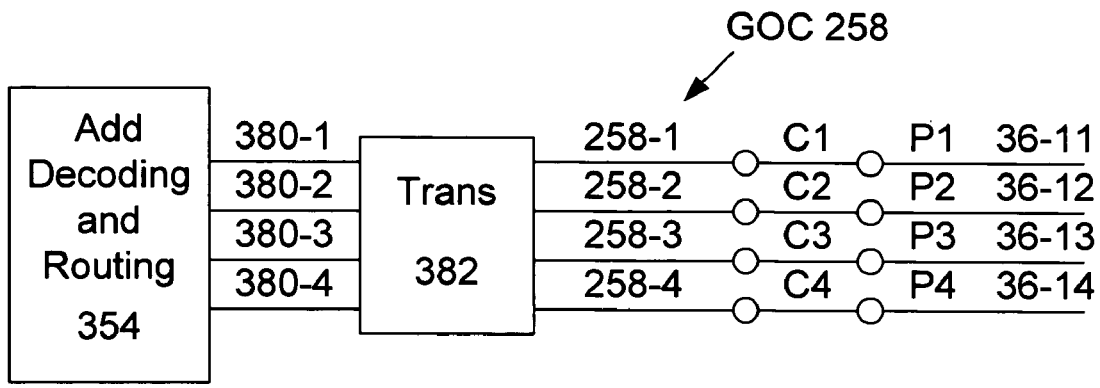
FIGS. 7-8 are each schematic representations of a portion of a memory device with chip interface points and package interface points.
Figure 8:
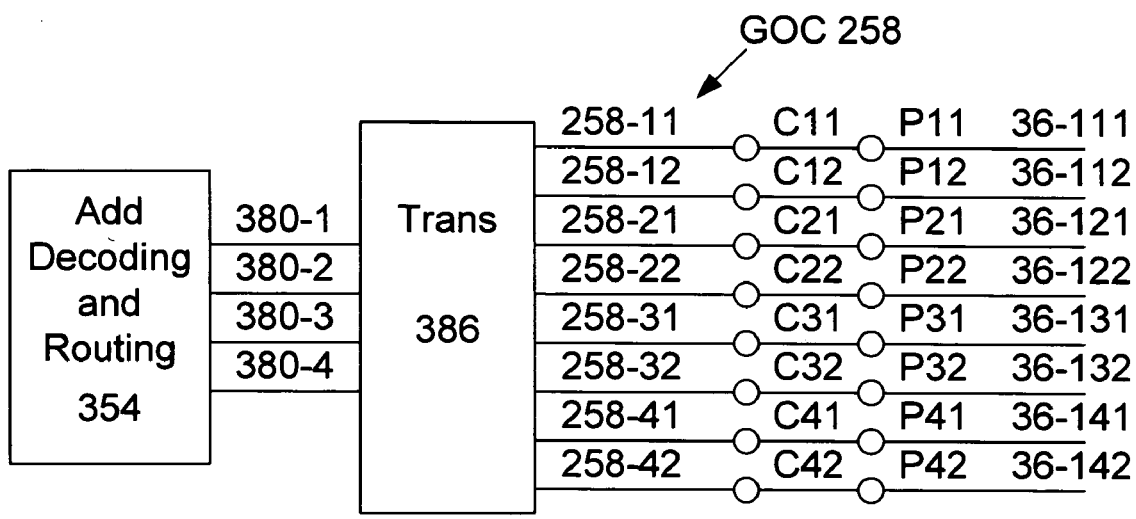

FIG. 7 illustrates address decoding and routing circuitry 354 (also in FIG. 6) that is coupled to transmitters 382 through lines 380-1, 380-2, 380-3, and 380-4 and provides read data on output conductors 258-1, 258-2, 258-3, and 258-4, which are conductors in group of conductors 258. Chip interface points C1, C2, C3, and C4 receive the read data signals and provide them to package interface points P1, P2, P3, and P4, which are coupled to conductors 36-11, 36-12, 36-13, and 36-14 of four lanes of interconnects 36-1. FIG. 8 is similar to FIG. 7 except that transmitters 386 output differential signals on conductors 258-11, 258-12, 258-21, 258-22, 258-31, 258-32, 258-41, and 258-42 which are part of group of conductors 258. Chip interface points C11, C12, C21, C22, C31, C32, C41, and C42 receive the read data signals and provide them to package interface points P11, P12, P21, P22, P31, P32, P41, and P42, which are coupled to conductors 36-111, 36-112, 36-121, 36-122, 36-131, 36-132, 36-141, and 36-142 of four lanes of interconnects 36-1. In some embodiments, the chip interface points for groups of conductors 258, 268, 278, and 288 are on four different ends of the chip.

Figure 9:
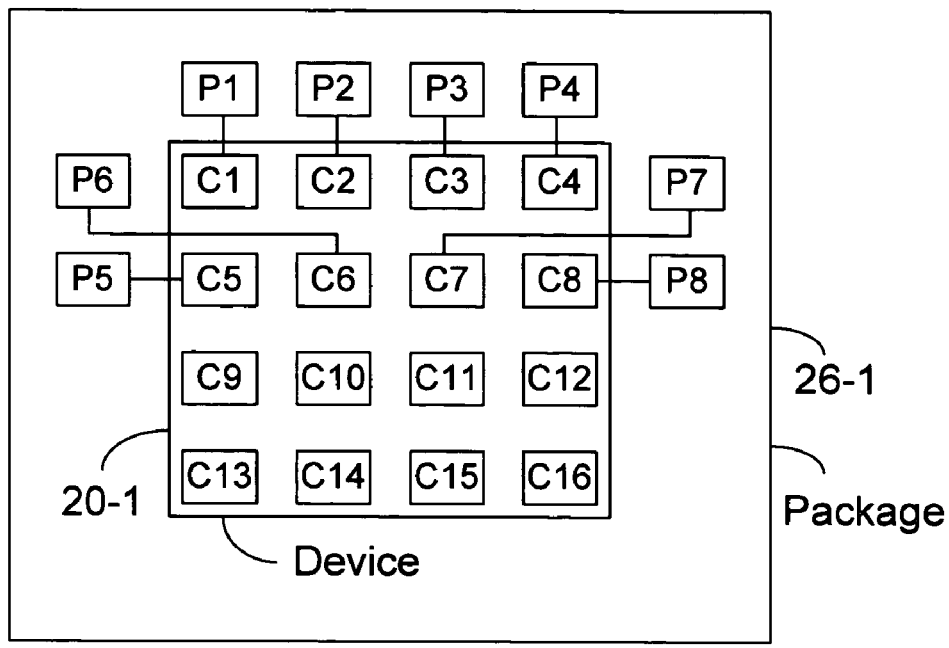
FIGS. 9-10 are each schematic representations of a memory device with chip interface points and a package with package interface points.
Figure 10:
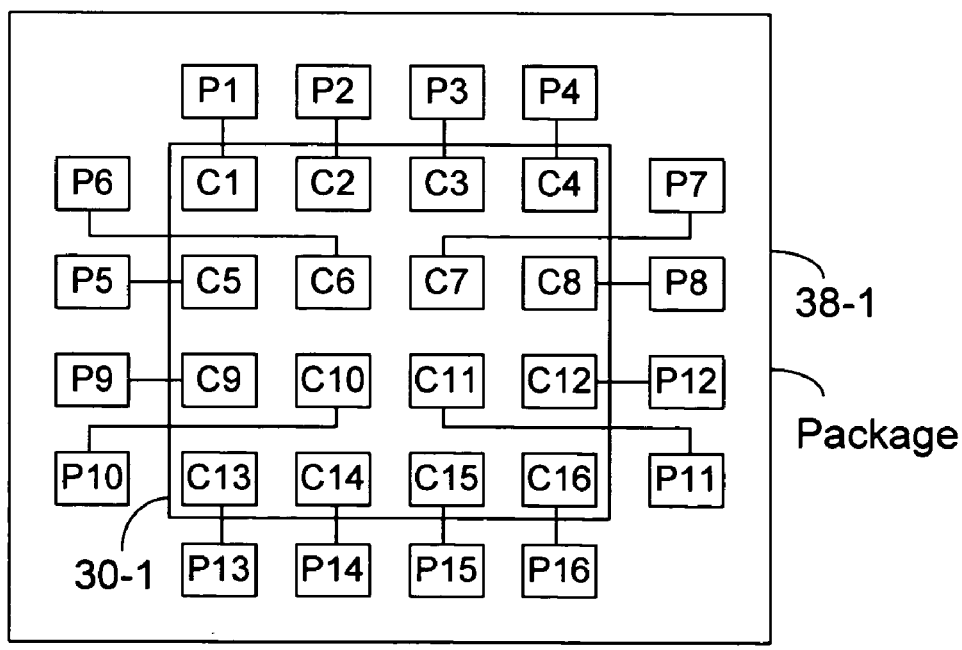

FIGS. 9 and 10 illustrate examples of packaging of memory devices 20-1 and 30-1 in packages 26-1 and 38-1, but memory devices 20-1 and 30-1 and packages 26-1 and 38-1 may be different than shown. FIG. 9 illustrates chip interface points C1, C2, . . . C16 for memory device 20-1. Of these points, only points C1 . . . C8 are coupled to package interface points P1, P2 . . . P8 of package 26-1. Interface points C9 . . . C16 are not coupled to package points.

FIG. 10 illustrates memory device 30-1 with chip interface points C1-C16 that are coupled with package interface points P1-P16. If differential signaling is used (two lines per lane), then the number of interface points for the output data would double. In the chips and packages of FIGS. 9 and 10, in practice, there would be many additional interface points for other signals, but for purposes of illustration only part of them are shown. In some systems, the memory device and package of FIG. 10 would only be used for X16 implementations, but in other systems, they could be used for either X8 or X16 systems. The details of FIGS. 7-10 are not required for all embodiments.

Figure 11:
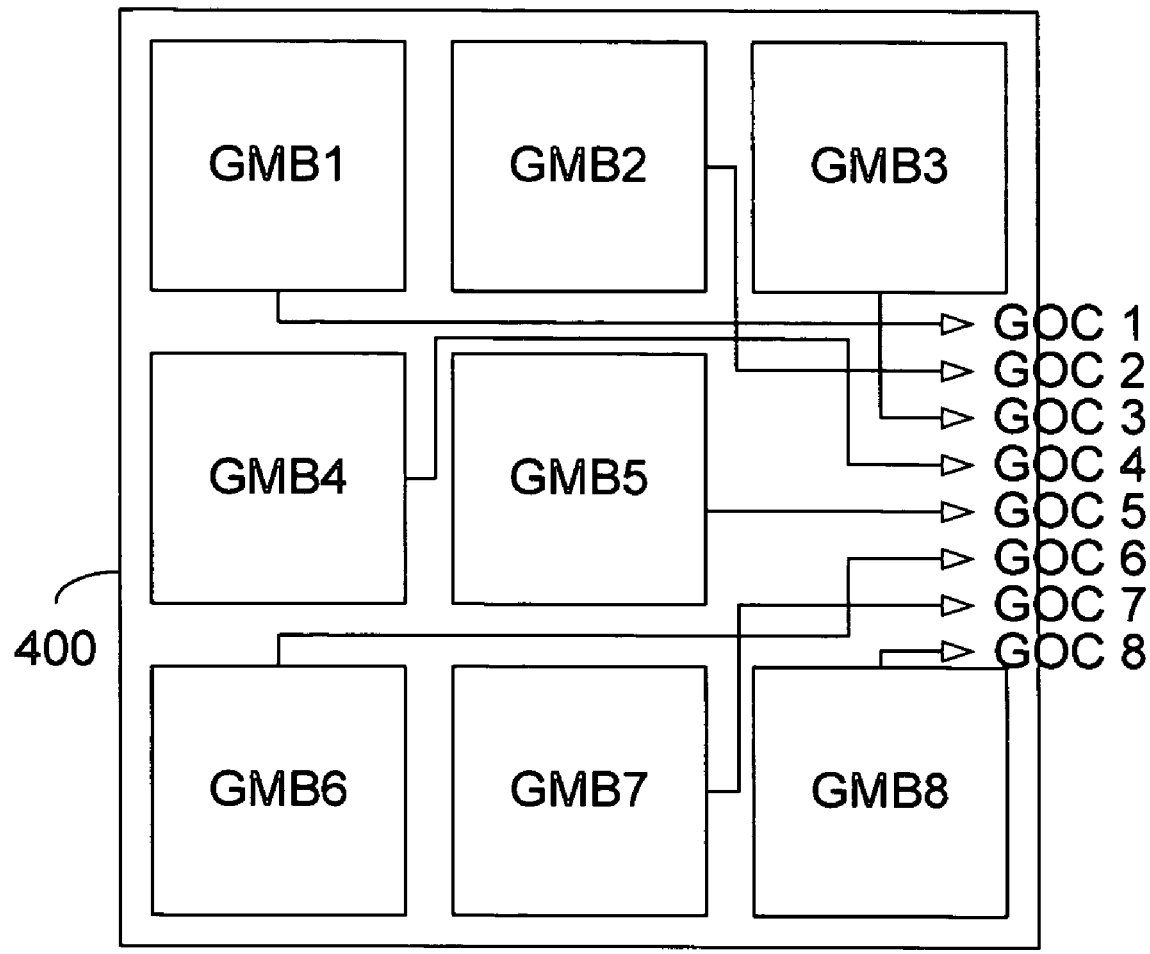
FIG. 11 is a schematic block diagram representation of a memory device with eight groups of memory banks.

FIG. 11 illustrates a memory device 400 with eight groups of memory banks GMB1, GMB2, . . . GMB8 that provide read data to groups of conductors GOC 1, GOC 2 . . . GOC8.

Memory device 30-1 in FIGS. 5 and 6 could be changed to a X8 chip by having the sense amplifiers of the banks of 4A-7A and 5B-7B provide there signals to groups of conductors 258 and 268 rather than to groups of conductors 278 and 288. Otherwise, memory device 30-1 would act as memory device 20-1 as described in connection with FIGS. 3 and 4. In some embodiments, the memory devices also have a X32 mode or a X4 mode. In some embodiments, the memory devices have a X16 mode and a X32 mode. In some embodiments, memory controller 12 or 32 sends a signal to the memory devices to control whether they are in X8 or X16 mode. In some embodiments, whether the memory devices are to be in X8 or X16 mode can be determined by the memory controller sensing whether the number of operating data lanes. In some embodiments, the group of conductors might include lines for eight bits, rather than the four bits described above.

There are various approaches to determining whether the memory devices are capable of X8 or X16 operation. In one approach, the chip (such as a serial presence detect (SPD)) on the memory module contains this information and the memory controller reads it. The memory controller then sends appropriate signals to the memory devices. If the memory devices may operate in either X8 or X16 mode, then the memory controller may provide signals to indicate which mode the memory devices should be in.

The memory controllers and memory devices described herein may be included in a variety of systems. For example, referring to FIG. 12, chip 404 includes a memory controller 406. Memory controller 406 and memory devices 410-1 . . . 410-M, and 420-1 . . . 420-M represent the various memory controllers, and memory devices described herein. Conductors 408-1 . . . 408-M each represent one of more unidirectional or bidirectional interconnects described herein. A memory device may repeat signals to a next memory device. For example, memory devices 410-1 . . . 410-M repeat some signals to memory device 420-1 . . . 420-M through interconnects 416-1 . . . 416-M. The signals may include command, address, and write data. The signals may also include read data. Read data may be sent directly to be sent from chips 410-1 . . . 410-M to memory controller 406 through interconnects 408-1 . . . 408-M. However, if read data is repeated from memory devices 410-1 . . . 410-M to chips 420-1 . . . 420-M then, in some embodiments, the read data is not also sent directly to be sent from chips 410-1 . . . 410-M to memory controller 406. Read data from memory devices 420-1 . . . 420-M may be sent to memory controller 406 through interconnects 418-1 . . . 418-M. Interconnects 418-1 . . . 418-M are not included in some embodiments.

Figure 12:
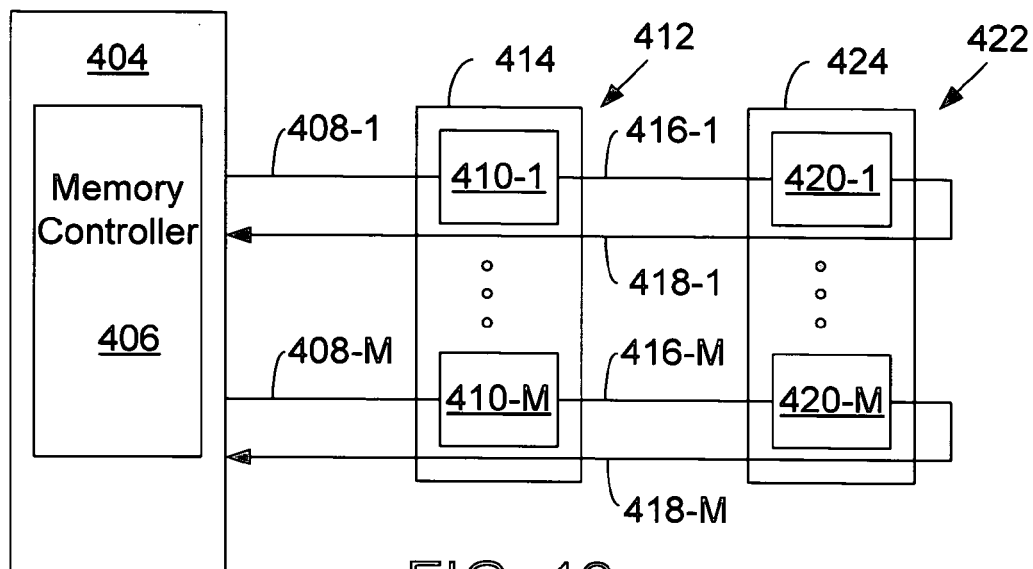

Still referring to FIG. 12, memory devices 410-1 . . . 410-M may be on one or both sides of a substrate 414 of a memory module 412. Memory devices 420-1 . . . 420-M may be on one or both sides of a substrate 424 of a memory module 422. Alternatively, memory devices 410-1 . . . 410-M may be on the motherboard that supports chip 404 and module 424. In this case, substrate 414 represents a portion of the motherboard. Where FIG. 12 or the other figures shows a single memory device, there may be a chain of memory devices.

Figure 13:
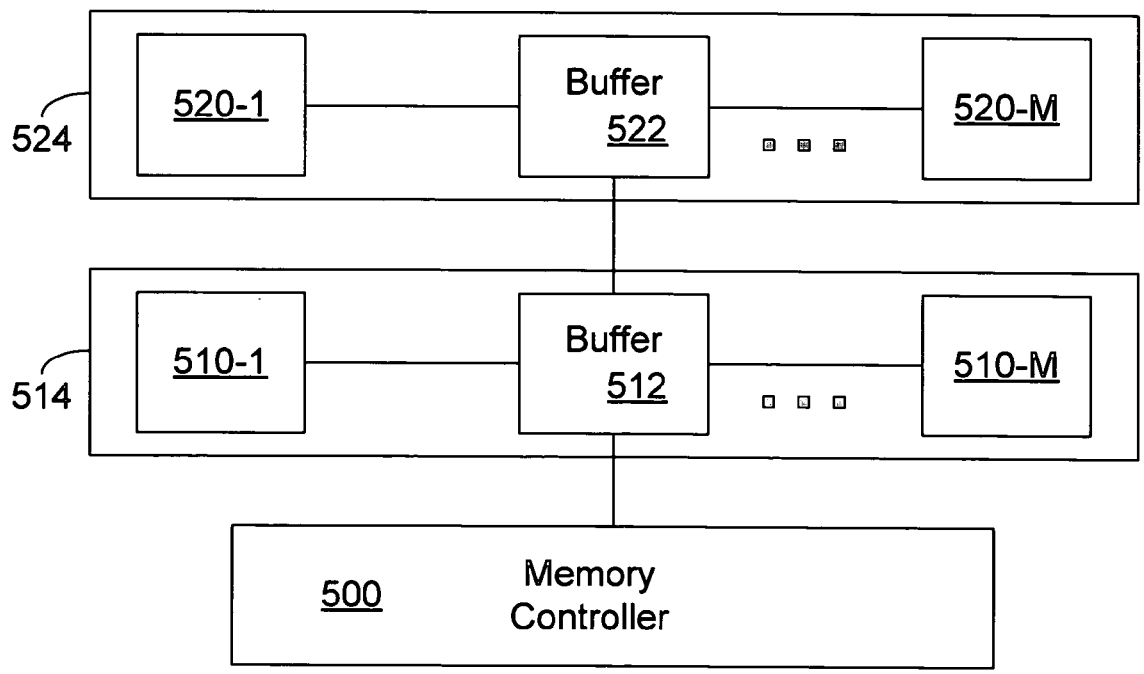

FIG. 13 illustrates a system in which memory devices 510-1 . . . 510-M are on one or both sides of a memory module substrate 514 and memory devices 520-1 . . . 520-M are on one or both sides of a memory module substrate 524. In some embodiments, memory controller 500 and memory devices 510-1 . . . 510-M communicate to each other through buffer 512, and memory controller 500 and memory devices 520-1 . . . 520-M communicate through buffers 512 and 522. In such a buffered system, the memory controller can use different signaling with the buffer than the buffer uses with the memory devices. These memory devices and memory controller 500 represent memory devices and memory controllers described herein. Some embodiments may include additional conductors not shown in FIG. 13. The invention are not restricted to the details of FIG. 13. For example, memory controller 500 could communicate directly with buffer 522, rather than through buffer 512.

FIG. 14 illustrates first and second channels 536 and 538 coupled to a chip 532 including a memory controller 534. Channels 536 and 538 are coupled to memory modules 542 and 544, respectively, that include memory devices such as are described herein.

In FIG. 15, a memory controller 552 (which represents any of previously mentioned memory controllers) is included in a chip 550, which also includes one or more processor cores 554. An input/output controller chip 556 is coupled to chip 550 and is also coupled to wireless transmitter and receiver circuitry 558. In FIG. 16, memory controller 552 is included in a chip 574. which may be a hub chip. Chip 574 is coupled between a chip 570 (which includes one or more processor cores 572) and an input/output controller chip 578. Input/output controller chip 578 is coupled to wireless transmitter and receiver circuitry 558.

An example of a chip interface point is a bond pad, but other structures could act as chip interface points. An ODIC (outer data, inner command) bailout arrangement may be used were 4 or 8 balls are added to each side of the chip, but that is not required. As other examples, wire bonds, flip chip, and stacked chip arrangements may be used.

In some embodiments, memory devices such as are described above may work well for a tFAW (fifth activate window).

In prior art memories, the memory device substantially increased in size as the number of prefetch data lines doubled. In some embodiments of the invention, a X16 memory device is only a small amount larger than a similar X4/X8 device. One estimate is that the prior art approach of doubling the number of internal prefetch lines may lead to on the order of a +21% increase in die size, whereas using the approach described in connection with FIG. 5 may have an increase of around 3% in die size as compared to the device of FIG. 3. Of course, these percent increases would not be expected for all implementations.

Although the figures have been described in connection with read data signals, they may be used essentially in reverse with some additional circuitry to write data into the banks. For example, in some embodiments, the write data on interconnects 36-1 is received by a write buffer which in turn provides write data to conductors 258-11 . . . 258-42 of FIG. 8. In such a case, circuitry in place of transmitters 386 provides the write data to address decoding and routing circuitry 354 or similar circuitry. Demultiplexer circuitry converts the signals on four conductors (such as 380-1 . . . 380-4) to signals on 64 conductors to be provided to a bank.

Additional Information and Embodiments

As used herein, the term "simultaneously" means at the same time, but not necessarily in the same clock cycle or strobe cycle. For example, where two banks are read from simultaneously, they may provide their read data up to a few clock cycles apart because it might take a different amount of time to read from different banks.

It is noted that the basic idea of simultaneously reading from two banks in two different groups of banks such as is described in connection with FIGS. 3 and 4 was thought of by a combination of the Intel engineers named as inventors in this patent application and engineers from another company (which are not included as inventors in this application).

The inventions are not restricted to any particular signaling techniques or protocols. For example, the signaling may be single ended or differential. The signaling may include only two voltage levels or more than two voltage levels. The signaling may be single data rate, double data rate, quad data rate, or octal data, etc. The signaling may involve encoded symbols and/or packetized signals. A clock (or strobe) signal may be transmitted separately from the signals or embedded in the signals. Various coding techniques may be used. The inventions are not restricted to a particular type of transmitters and receivers. Various clocking techniques could be used in the transmitters and receivers and other circuits. The interconnects between chips each could be point-to-point or each could be in a multi-drop arrangement, or some could be point-to-point while others are a multi-drop arrangement.

In actual implementations of the systems of the figures, there would be additional circuitry, control lines, and perhaps interconnects which are not illustrated. When the figures show two blocks connected through conductors, there may be intermediate circuitry that is not illustrated. The shape and relative sizes of the blocks is not intended to relate to actual shapes and relative sizes.

As an example, the banks of FIGS. 3-6 may each have page sizes of 1K so that when two banks are activated together the provide 2K pages. Other page sizes may be used.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances of "an embodiment," "one embodiment," or "some embodiments" are not necessarily all referring to the same embodiments.

When it is said the element "A" is coupled to element "B," element A may be directly coupled to element B or be indirectly coupled through, for example, element C.

When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B."

If the specification states a component, feature, structure, process, or characteristic "may", "might", or "could" be included, that particular component, feature, structure, process, or characteristic is not required to be included. If the specification or claim refers to "a" or "an" element, that does not mean there is only one of the element.

The inventions are not restricted to the particular details described herein. Indeed, many other variations of the foregoing description and drawings may be made within the scope of the present inventions. Accordingly, it is the following claims including any amendments thereto that define the scope of the inventions.

What is claimed is:

1. A chip comprising:
   at least four groups of memory banks;
   at least four groups of output conductors wherein each group of output conductors corresponds to a different one of the groups of memory banks;
   at least four groups of multiplexers wherein each of the groups of multiplexers corresponds to a different one of the groups of memory banks, wherein each of the group of multiplexers includes at least one multiplexer
   circuitry to perform a read operation by providing read data from at least one of the banks of each of the groups of memory banks through its corresponding group of multiplexers to its corresponding group of output conductors, wherein the memory banks, groups of output conductors, and circuitry to perform a read operation are each part of the chip; and
   a set of transmitters corresponding to each group of output conductors, and wherein there are a particular number of lines between the banks and the corresponding multiplexers and fewer lines between each of the multiplexers and the corresponding groups of output conductors.

2. The chip of claim 1, wherein the circuitry to perform the read operation provides read data from only one of the banks of each of the groups of memory banks for each read operation.

3. The chip of claim 1, wherein the at least four groups of memory banks includes only four groups of memory banks and the at least four groups of output conductors includes only four groups of output conductors.

4. The chip of claim 3, wherein the chip includes additional groups of output conductors not included in the at least four groups of output conductors.

5. The chip of claim 1, wherein the at least four groups of memory banks includes eight groups of memory banks and the at least four groups of output conductors includes eight groups of output conductors.

6. The chip of claim 1, wherein the at least four groups of output conductors each include eight conductors to carry four differential signals.

7. The chip of claim 1, wherein the at least groups of output conductors each include four conductors to carry four signals.

8. The chip of claim 1, wherein the output conductors are also input conductors.

9. The chip of claim 1, wherein there are sixty-four lines between the banks and the corresponding multiplexers and four lines between each of the multiplexers and the corresponding groups of output conductors.

10. The chip of claim 1, wherein the circuitry to perform a read operation causes the read data to be read from the at least one bank of the groups of memory banks simultaneously.

11. The chip of claim 1, further comprising bank group forming circuitry to selectively form sets of groups of the memory banks, wherein the sets include a first set with four groups of the memory banks and a second set with a different number of groups of the memory banks.

12. A chip comprising:
    memory banks;
    bank group forming circuitry to selectively form sets of groups of the memory banks, wherein the sets include a first set with four groups of the memory banks and a second set with a different number of groups of the memory banks, wherein the bank group forming circuitry includes a fuse a state of which is used to select the sets of groups;
    at least four groups of output conductors, at least some of which correspond to different one of the groups of the memory banks;
    at least four groups of multiplexers wherein each of the groups of multiplexers corresponds to a different one of the groups of memory banks, wherein each of the group of multiplexers includes at least one multiplexer; and
    circuitry to perform a read operation by providing read data from at least one of the banks of each of the groups of the memory banks through its corresponding group of multiplexers to its corresponding group of output conductors, wherein the memory banks, bank group forming circuitry, groups of output conductors, and circuitry to perform a read operation are each part of the chip.

13. The chip of claim 12, wherein when the bank group forming circuitry forms the first set, each of the groups of output conductors receive read data as part of the read operation.

14. The chip of claim 12, wherein when the bank group forming circuitry forms the second set, some of the four groups of output conductors do not receive read data as part of the read operation.

15. The chip of claim 12, wherein the bank group forming circuitry may selected a third set which yet a different number of groups of memory banks.

16. A chip comprising:
    groups of memory banks;
    groups of output conductors wherein each group of output conductors corresponds to a different one of the groups of memory banks, wherein the groups of output conductors include enough output conductors for sixteen lanes;
    groups of multiplexers wherein each of the groups of multiplexers corresponds to a different one of the groups of memory banks, wherein each of the group of multiplexers includes at least one multiplexer; and
    circuitry to perform a read operation by providing read data from at least one of the banks of each of the groups of memory banks through its corresponding group of multiplexers to its corresponding group of output conductors, wherein the memory banks, groups of output conductors, and circuitry to perform a read operation are each part of the chip; and
    a set of transmitters corresponding to each group of output conductors, and wherein there are a particular number of lines between the banks and the corresponding multiplexers and fewer lines between each of the multiplexers and the corresponding groups of output conductors.

17. The chip of claim 16, wherein the circuitry to perform the read operation provides read data from only one of the banks of each of the groups of memory banks for each read operation.

18. The chip of claim 16, wherein the groups of memory banks includes four groups of memory banks and the groups of output conductors includes four groups of output conductors.

19. A system comprising:
    a first chip including a memory controller:
    interconnects coupled to the memory controller; and
    a second chip including:
    at least four groups of memory banks;
    at least four groups of output conductors wherein each group of output conductors corresponds to a different one of the groups of memory banks;
    bank group forming circuitry to selectively form sets of groups of the memory banks, wherein the sets include a first set with four groups of the memory banks and a second set with a different number of groups of the memory banks, wherein the bank group forming circuitry includes a fuse a state of which is used to select the sets of groups;
    at least four groups of multiplexers wherein each of the groups of multiplexers corresponds to a different one of the groups of memory banks, wherein each of the group of multiplexers includes at least one multiplexer; and
    circuitry to perform a read operation by providing read data from at least one of the banks of each of the groups of memory banks through its corresponding group of multiplexers to its corresponding group of output conductors, wherein the output conductors are coupled to some of the interconnects.

20. The system of claim 19, wherein the circuitry to perform the read operation provides read data from only one of the banks of each of the groups of memory banks for each read operation.

21. The system of claim 19, further comprising additional chips and additional interconnects coupled between the additional chips and the memory controller, wherein the additional chips are have structure functionally the same as those of the second chip.

22. The system of claim 19, wherein the first chip includes processor cores.

23. The system of claim 19, wherein the first chip is coupled to a chip with wireless transmitting and receiving circuitry.

24. The system of claim 19, wherein the circuitry to perform a read operation includes word lines, sense amplifiers, the multiplexers, and decoding and routing circuitry.

25. The system of claim 19, wherein the circuitry to perform a read operation causes the read data to be read from the at least one of the banks of the memory groups simultaneously.

26. The system of claim 19, further comprising a package including package interface points electrically coupled to at least some of the output conductors, and wherein the package interface points at least some of the output conductors.

27. The system of claim 19, wherein the system further includes chip interface points coupled to all of the output conductors.

28. The system of claim 19, wherein the system further includes chip interface points coupled to less than all of the output conductors.

* * * * *